United States Patent [19]
Yanagida

[11] Patent Number: 5,888,892
[45] Date of Patent: Mar. 30, 1999

[54] METAL LAYER PATTERN FORMING METHOD

[75] Inventor: Toshiharu Yanagida, Kanagawa, Japan

[73] Assignee: Sony Corporation, Tokyo, Japan

[21] Appl. No.: 650,271

[22] Filed: May 22, 1996

[30] Foreign Application Priority Data

May 24, 1995 [JP] Japan .................................. 7-125119

[51] Int. Cl.[6] .................................................. H01L 21/445
[52] U.S. Cl. ........................ 438/614; 438/612; 438/613; 438/951
[58] Field of Search .................................. 438/612, 613, 438/614, 576, 577, 578, 951

[56] References Cited

U.S. PATENT DOCUMENTS

| | | | |
|---|---|---|---|
| 4,933,303 | 6/1990 | Mo | 437/195 |
| 5,137,845 | 8/1992 | Lochon et al. | 437/183 |
| 5,393,697 | 2/1995 | Chang et al. | 438/614 |
| 5,445,979 | 8/1995 | Hirano | 438/576 |
| 5,486,483 | 1/1996 | Lammert | 438/578 |

*Primary Examiner*—Caridad Everhart
*Attorney, Agent, or Firm*—Hill & Simpson

[57] ABSTRACT

Disclosed is a metal layer pattern forming method which easily allows lift-off. The thickness of the photoresist layer is not less than double the thickness of the metal layer, and the maximum temperature that the surface of the substrate to be processed attains ranges from 100° C. to 150° C. Through appropriate improvement of the quality of the photoresist layer, bonding to the background is prevented and the lift-off is facilitated.

11 Claims, 5 Drawing Sheets

METAL LAYER PATTERN FORMING METHOD

BACKGROUND OF THE INVENTION

1. Field of the Invention

The present invention relates to a pattern forming process for a metal layer serving as the base of a bump, which process constitutes a part of a process for manufacturing a flip chip IC, in which a metal bump formed on the surface of a semiconductor base is surface-joined to an electrode formed on the surface of a printed circuit board.

2. Description of the Related Art

For further progression of the miniaturization of electronic devices, an improvement in parts mounting density is a key factor. In connection with semiconductor ICs, the development of high-density mounting techniques based on flip chips is being actively carried forward as a replacement for the conventional package mounting.

There are several types of flip chip mounting methods, such as an Au stud bump method and a solder ball bump method. In any of these methods, a barrier metal is provided between the electrode pad of the semiconductor IC and the bump material for the purpose of achieving an improvement in closeness of contact, preventing mutual diffusion, etc. In the case of the solder ball bump method, this barrier metal determines the finish configuration of the bump, so that it is also called BLM (ball limiting metal). The most typical structure of the BLM layer in the solder bump method is a three-layered structure consisting of Cr, Cu and Au layers. Of these, the Cr layer, which is the lowest layer, serves as the layer which comes into close contact with the electrode pad; the Cu layer serves as the layer for preventing diffusion of the solder; and the top layer, that is, the Au layer, serves as the layer for preventing oxidation of the Cu. The patterning of the BLM layer might be performed by a wet etching method using a liquid agent. In that case, however, various problems would be involved, including poor operability, environmental problems due to the waste liquid, poor accuracy in machining, etc.

In view of this, use of a lift-off process as the patterning method for the BLM layer is being considered, in which process a photoresist layer is formed and then separated. In this case, the formation of the BLM layer is usually conducted by using a sputtering apparatus, which leads to a problem in that the formation of the BLM layer tends to extend to the side wall surfaces of the background resist pattern, with the result that the resist separation liquid does not penetrate when the lift-off is to be effected, thereby making it difficult to remove the unnecessary portion of the BLM layer. In view of this, it is necessary to control the configuration of the edge surface of the opening of the photoresist such that it has an overhang-like configuration for the purpose of attaining an improvement in separability in the lift-off operation. This control of the resist configuration might be realized by a lithography process. However, that would involve an increase in the number of steps to be taken. It would be ideal if the control of the resist pattern configuration could be effected during the plasma irradiation, which is usually performed in the process prior to the formation of the BLM layer by sputtering.

Conventionally, a plane parallel plate type plasma processing apparatus as shown in FIG. 3 has been used for the purpose of executing the plasma irradiation prior to the formation of the metal layer. The plasma processing apparatus 1 of FIG. 3 includes a plasma processing chamber 2 in which a vacuum is created; a stage 4 (cathode plate) on which a substrate to be processed 3 is placed; and an anode plate 5 that is opposed to the stage 4, which is connected to a high-frequency power source 6 through the intermediation of a coupling capacitor 7.

When performing the patterning of the metal by the lift-off of the photoresist, the background resist pattern is deformed into an overhang-like configuration by thermal transformation and ion irradiation, and a break is formed at an edge of the BLM layer formed thereon (Any portion where the step coverage of the sputtering layer is rather poor is utilized for this purpose). Then, a resist separation liquid is caused to penetrate through this break to remove the unnecessary portion of the BLM layer to thereby complete the patterning.

However, to perform the control of the background resist pattern through this plasma irradiation in a stable manner, selection of the thickness of the resist layer is also an important factor to be taken into consideration. When a resist pattern of a conventional thickness of approximately 1 $\mu$m is used, the region which undergoes thermal transformation by the plasma irradiation will not remain in the resist surface layer but be allowed to reach the interface between that and the background. As a result, the resist layer is bonded to the background, thereby making it difficult to remove the resist pattern by the lift-off in the post-process.

This might be avoided by reducing the plasma irradiation amount. However, a reduction in the plasma irradiation amount would result in an in sufficient deformation in the opening edge of the resist pattern, so that the BLM layer formed will be allowed to reach the side wall of the resist pattern, thereby making it completely impossible for the resist separation liquid to penetrate. Thus, the patterning by lift-off will not be completed (See FIG. 1).

Further, in the conventional pre-metal-layer-formation process, no special attention is paid to the increase in the temperature of the wafer during the process, so that the maximum temperature of the wafer surface when the plasma processing is performed under the normal conditions will generally reach 200° C. to 250° C.

When such a processing is conducted on a specimen wafer on which pattern formation has been performed, the opening edge of the resist pattern will be deformed so as to protrude obliquely upward (See FIG. 2B).

It is to be assumed that this is due to the fact that the original molecular structure of the resist layer surface is destroyed by the excessive heat energy applied rapidly thereto, with the result that it undergoes contraction, this surface stress overcoming the force due to thermal expansion with which the resist end portions would expand laterally.

In this case, the overhang of the resist opening is insufficient, so that sputter particles are allowed to reach the pattern side walls to form a BLM layer. Thus, in the post process of lift-off, the penetration of the separation liquid does not proceed, so that the patterning is not completed. Further, the resist portion which has undergone excessive thermal transformation is carbonized and bonded to the background (See FIG. 2D).

It is accordingly an object of the present invention to provide a metal layer pattern forming method which makes it possible for the configuration of the resist layer to be easily controlled in the pre-processing step prior to the step of forming a BLM (ball limiting metal) layer serving as the multiple metal layer in the formation of a ball bump in a flip chip IC or the like and which does not affect the lower layer.

SUMMARY OF THE INVENTION

To achieve the above object, the present invention provides a metal layer pattern forming method including a pre-processing step of the BLM-layer-forming step, in which plasma irradiation, the formation of a metal layer, and a lift-off process are effected on a substrate to be processed consisting of a semiconductor base on which an electrode pad, a surface protecting layer and a photoresist layer are successively stacked, wherein the thickness of the photoresist layer is double the thickness of the metal layer or more.

In a second aspect of the present invention, in the pre-processing step of the BLM-layer-forming step, the processing condition is set such that the maximum temperature that the surface of the substrate to be processed attains is 100° C. to 150° C.

Further, in the plasma processing, it is desirable to use a plasma processing apparatus having a high-density plasma source capable of obtaining a plasma density of not less than $1 \times 10^{14}$ cm$^3$ but less than $1 \times 10$ cm$^{-3}$, such as ICP (Inductively Coupled Plasma), TCP (Transfer Coupled Plasma), ECR (Electron Coupled Resonance) or helicon wave plasma.

In the present invention, the photoresist layer is sufficiently thicker than the metal layer, so that there is substantially no formation of the metal layer on the side wall of the photoresist layer. Further, the region affected by the thermal transformation does not reach the interface leading to the lower layer, so that the unnecessary portion of the metal layer can be easily separated in the lift-off process.

In the second aspect of the present invention, the surface quality of the photoresist layer can be appropriately improved, so that no excessive thermal transformation takes place.

Further, by using a plasma processing apparatus having a high-density plasma source that is capable of obtaining a plasma density of not less than $1 \times 10^{11}$ cm$^{-3}$ but less than $1 \times 10^{14}$ cm$^3$, such as ICP (Inductively Coupled Plasma), TCP (Transfer Coupled Plasma), ECR (Electron Coupled Resonance) or helicon wave plasma, the substrate bias voltage and the plasma power can be independently controlled.

BRIEF DESCRIPTION OF THE DRAWINGS

FIGS. 1A through 1D are sectional views showing how the state of a substrate to be processed changes as the conventional manufacturing process using a thin-film resist pattern proceeds, of which FIG. 1A shows the state in which a photoresist layer has been formed around the connection hole of a passivation layer facing the electrode pad;

FIG. 1B shows the state in which the opening configuration of the photoresist layer has been slightly changed by a pre-film-formation process;

FIG. 1C shows the state in which a BLM layer has been formed; and

FIG. 1D shows the state in which resist separation does not proceed, with the patterning by lift-off not being completed;

FIGS. 2A through 2D are sectional views showing how the state of a substrate to be processed on which the metal layer has been formed under the conventional condition of a high rise in wafer temperature changes as the manufacturing process proceeds, of which FIG. 2A shows the state in which a thick photoresist layer has been formed around the connection hole of a passivation layer facing the electrode pad;

FIG. 2B shows the state in which the opening edge configuration of the photoresist layer has been slightly hanged by a pre-film-formation process;

FIG. 2C shows the state in which a BLM layer has been formed; and

FIG. 2D shows the state in which resist separation does not proceed, with the patterning by lift-off not being completed;

FIGS. 4A through 4D are sectional views showing how the state of a substrate to be processed changes as a manufacturing process according to the present invention proceeds, of which FIG. 4A shows the state in which a photoresist layer has been formed around the connection hole of a passivation layer facing the electrode pad;

FIG. 4B shows the state in which the opening configuration of the photoresist layer has been slightly changed by a pre-film-formation process;

FIG. 4C shows the state in which a BLM layer has been formed; and

FIG. 4D shows the state in which resist separation does not proceed, with the patterning of the BLM layer by lift-being off being completed;

DESCRIPTION OF THE PREFERRED EMBODIMENTS

Metal layer pattern forming methods according to the present invention will now be described with reference to FIGS. 4 through 6.

First Embodiment

In this embodiment, the present invention is applied to the patterning of a BLM (ball limiting metal) layer consisting of a metal layer when a solder ball bump is formed.

Figure 4A:
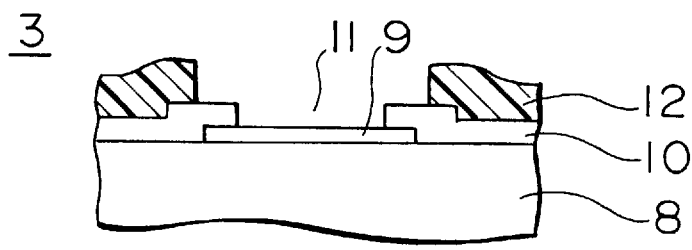
Figure 5:
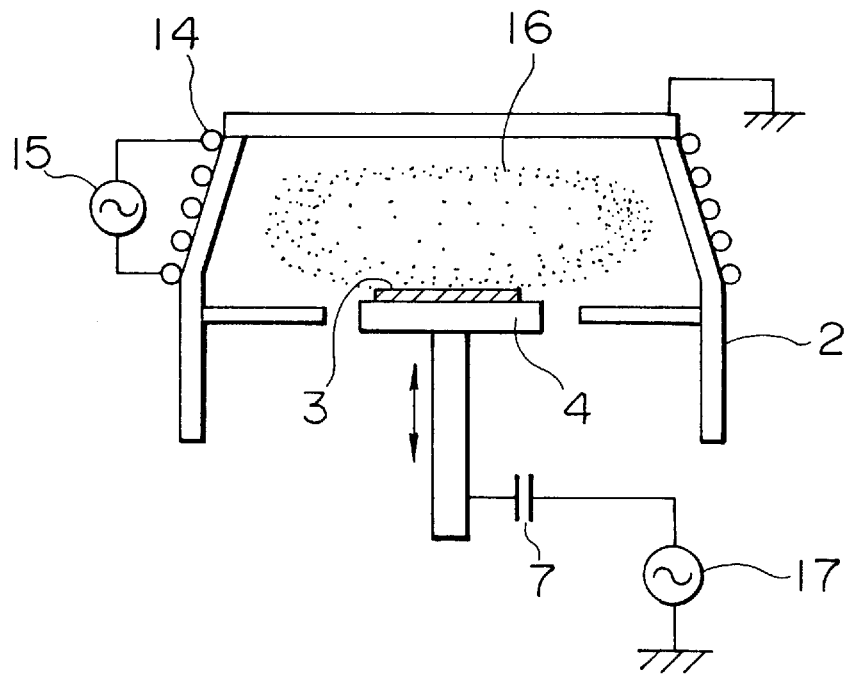
FIG. 5 is a schematic sectional view of a plasma processing apparatus on which an ICP (inductively coupled plasma) is mounted.

As shown in FIG. 4A, in the substrate to be processed 3 (wafer) used as a sample in this embodiment, a passivation layer (a surface protecting layer) 10 of polyimide, silicon nitride film or the like is formed on an aluminum electrode pad 9 of a semiconductor base 8, and a connection hole 11 of a predetermined size is formed, and further, a photoresist layer 12 is formed thereon and patterned so as to have an opening diameter larger than that of the passivation layer 10.

Figure 1A:
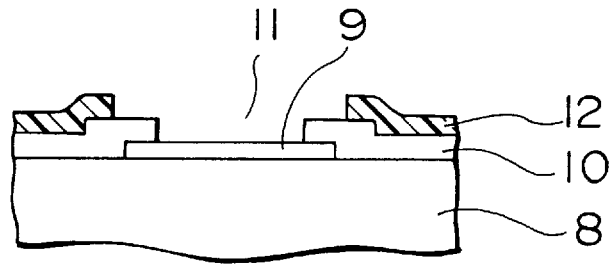
Figure 1B:
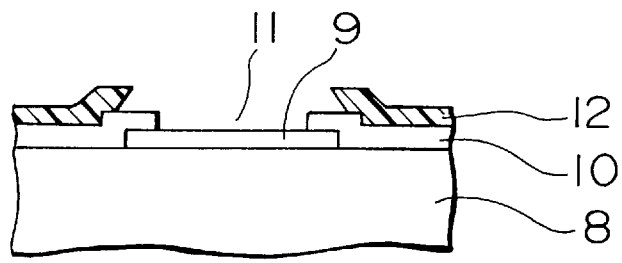
Figure 1C:
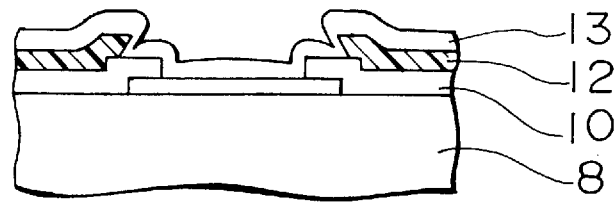
Figure 1D:
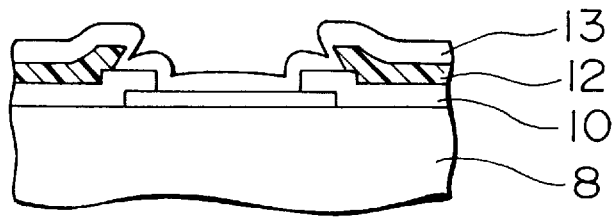
Figure 2A:
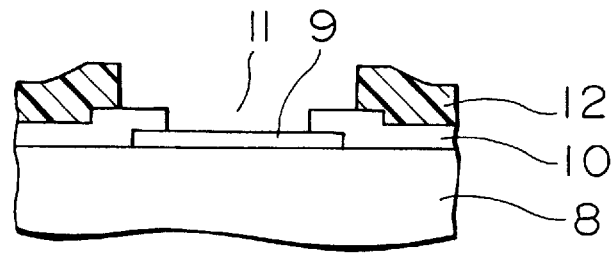
Figure 2B:
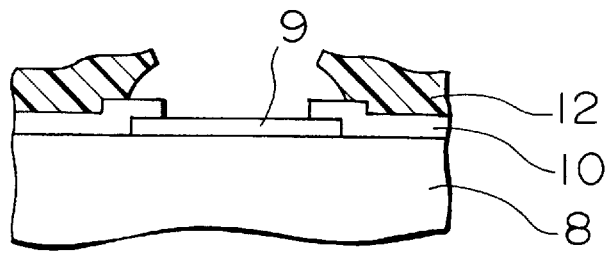
Figure 2C:
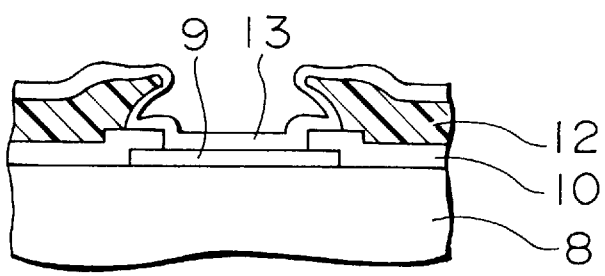
Figure 2D:
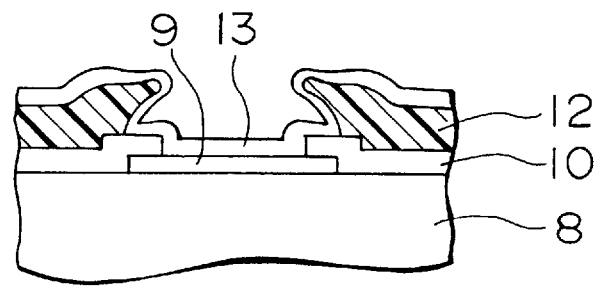
Figure 3:
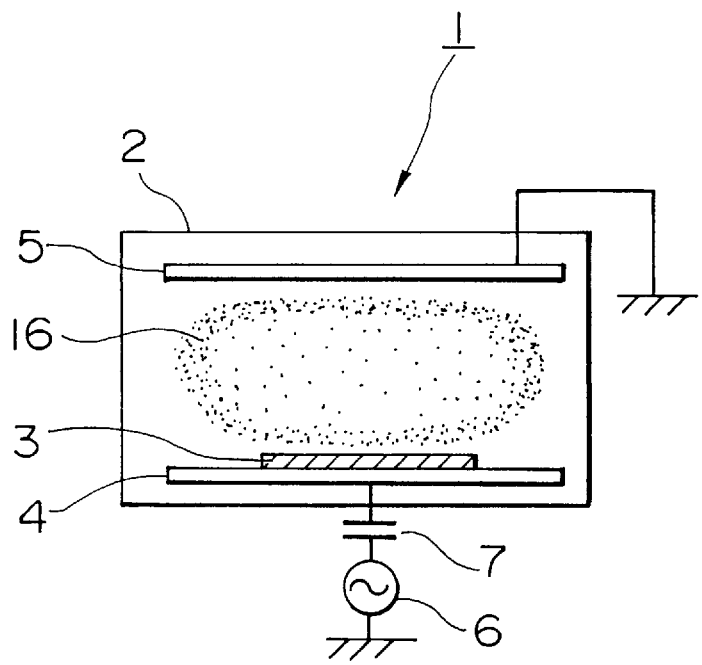
FIG. 3 is a schematic sectional view of a plane parallel plate type plasma processing apparatus.
Figure 4B:
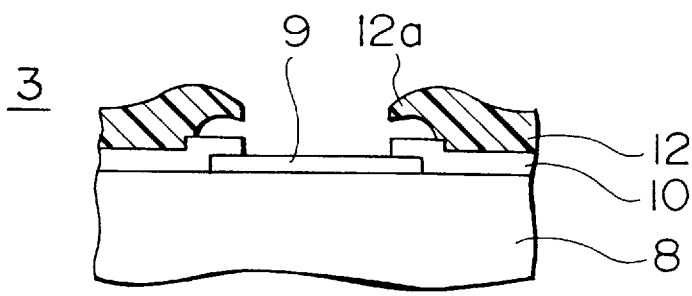

Here, the patterning of the photoresist layer 12 is performed in a thickness of 3 μm, which is not less than double the thickness of the BLM layer (1.2 μm) to be formed next. Then, this wafer is conveyed to a plane parallel plate type RF plasma processing apparatus as shown in FIG. 3, which is connected to a metal layer forming apparatus under high vacuum condition. By way of example, a premetal-layer-formation process was conducted under the following conditions:

Argon gas flow rate: 30 sccm
Argon gas pressure: 5 mTorr (0.67 Pa)
High-frequency electric power: 300 w (13.56 MHz)
Processing time: 6 minutes As a result of this plasma processing, the surface layer of the photoresist layer 12 of the substrate to be processed 3 was subjected to Ar$^+$ion irradiation, and the upper portion thereof protruded due to thermal expansion, with the cross section of the resist pattern being deformed into a protruding section 12a having an overhang configuration as shown in FIG. 4B.

The maximum temperature of the wafer surface in the processing under these conditions was approximately 115° to 135° C.

Figure 4C:
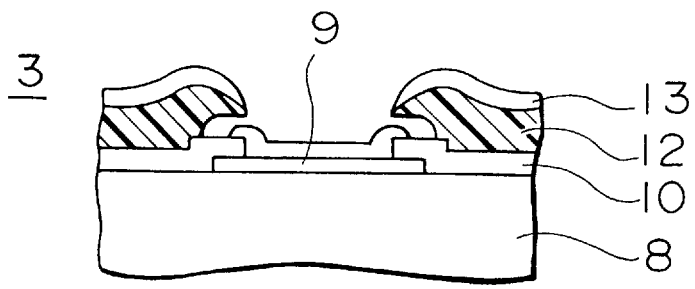

Next, this substrate to be processed 3, which had undergone pre-film-formation process, was conveyed to a metal film formation apparatus such as a sputtering apparatus which is connected through a gate valve under a high vacuum condition, and, for example, a chrome layer having a thickness of 0.1 μm, a copper layer having a thickness of 1.0 μm, and a gold layer having a thickness of 0.1 μm were successively stacked one upon the other by sputtering to thereby form a BLM layer 13. This state is shown in FIG. 4C.

No metal layer was formed on the side wall surface of the background resist pattern whose configuration was controlled so as to be an overhanging one by the above-described pre-metal-film-formation process, and the BLM layer 13 was divided between the opening portion on the electrode pad 9 and the resist layer 12.

Figure 4D:
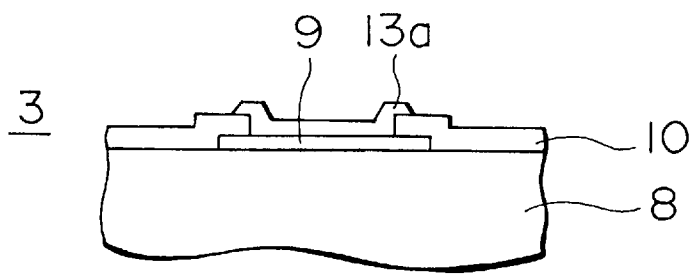

Then, the substrate to be processed 3 in this condition was immersed, for example, in a resist separation liquid composed of dimethyl sulfoxide $(CH_3)_2S_O$ and N-methyl-2-pyrrolidone $CH_3NC_4H_6O$ (stirred in the solution heated to approximately 95° C. with the result that the unnecessary portion of the BLM layer that had been formed on the photoresist 12 was lifted off simultaneously with the separation of the resist, as shown in FIG. 4D, and, as shown in FIG. 4D, the BLM layer pattern 13a was completed in the predetermined place of the connection hole 11.

Second Embodiment

In this embodiment, the present invention is similarly applied to the BLM layer patterning when a solder ball bump is formed, the present invention being executed by applying a plasma processing apparatus using ICP (inductively coupled plasma) as the plasma generation source to the pre-film-formation process of the metal layer sputtering process. The substrate to be processed in this embodiment is the same as the one used in the first embodiment, which is shown in FIG. 4A. A description of the components which are the same as those of the first embodiment will be omitted.

As in the case of the first embodiment, the patterning of the photoresist layer 12 is effected in a film thickness of 3 μm, which is not less than double the thickness of the BLM layer 13 to be formed next (1.2 μm).

An example of the construction of the ICP processing apparatus to be used in the pre-metal-layer-formation process of this embodiment will be schematically described with reference to FIGS. 5 and 6. This apparatus includes a plasma processing chamber 2 formed of a dielectric material like quartz and an inductive coupling coil 14 that is wound a number of turns around the side wall thereof. The power of the plasma power source 15 is supplied to the plasma processing chamber 2 by the inductive coupling coil 14, where a high-density plasma 16 is generated. The substrate to be processed 3 is placed on the substrate stage 4, to which the power of a substrate bias power source 17 is supplied. Further, though not shown, the apparatus is naturally equipped with various other requisite components, such as a processing gas inlet hole, a vacuum discharge system, a gate valve, and a conveying system for the substrate to be processed. This apparatus is characterized in that it is capable of plasma excitation with great electric power by means of the large-sized multi-turn inductive coupling coil 14, making it possible to perform high-density plasma processing of in the order of $10^{12}/cm^3$.

Further, it has an advantage in that it allows control of the incident ion energy independently of the plasma generation due to the substrate bias power source 17.

Figure 6:
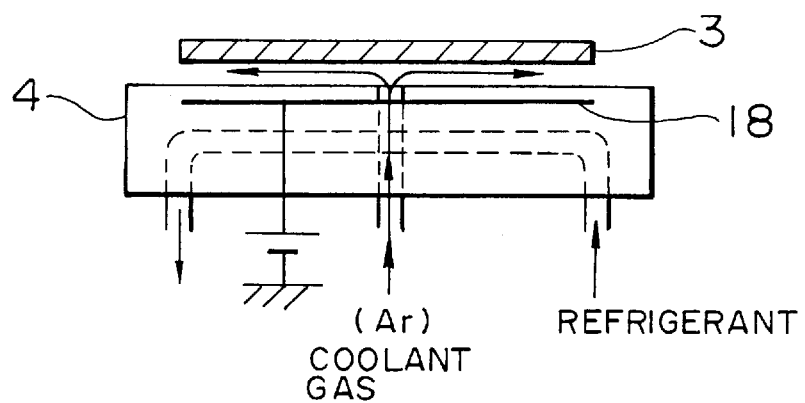
FIG. 6 is a schematic sectional view of a substrate stage that is equipped with a temperature control mechanism.

Further, in this embodiment, in order to improve the temperature control characteristics of the substrate to be processed 3, the substrate stage 4 is temperature-controlled by a refrigerant circulating inside the stage 4, as shown in FIG. 6, and the stage surface allows a satisfactory heat transfer between it and the substrate to be processed 3 by virtue of the electrostatic adsorption due to the electrostatic chuck 18 and gas cooling.

Due to this arrangement, it is possible to accurately control the wafer temperature during the pre-metal-layer-formation process even when continuous processing is performed.

As an apparatus equivalent to the ICP used in this embodiment, it also is possible to use TCP (transfer-coupled plasma), ECR (electron coupled resonance), helicon wave plasma, etc. By using these apparatuses, it is possible to obtain a plasma density of not less than $1 \times 10^{11}$ cm$^{-3}$ but less than $1 \times 10^{14}$ cm$^3$.

Next, the substrate to be processed 3 shown in FIG. 4A is set on the stage 4, and, by way of example, pre-metal-layer-formation processing was conducted under the following conditions:

Argon gas flow rate: 25 sccm

Gas pressure: 1 mTorr

Plasma power source: 1000 W (2 MHz)

Substrate bias power: 200 V (13.56 MHz)

Processing time: 45 seconds

In the case of the plane parallel plate type plasma processing apparatus of the first embodiment described above, the application of RF power that is high to some degree or more in order to stably continue the discharge and secure the uniformity in the processing speed. This inevitably causes the substrate bias voltage (cathode fall voltage) to be set at a relatively high level.

In this embodiment, in contrast, a plasma processing apparatus having two high-frequency power sources that are capable of independently controlling the substrate bias voltage and the plasma generation are used, so that the incident ion energy can be optimized without adversely affecting the discharge plasma. Thus, bonding to the background due to an excessive thermal transformation of the interior of the resist is not caused, making it possible to accurately set the substrate bias voltage so that the resist can be processed into an optimum configuration for lift-off.

Further, since a high-density plasma source is used, the absolute amount of ions generated increases, and the condition setting under low pressure is possible, thereby making it possible to restrain the scattering of the incident ions. Thus, a reduction in processing time can be achieved even if the substrate bias voltage is reduced.

Thus, in this embodiment, a substantial reduction in processing time can be achieved as compared to the first embodiment. As a result of this plasma processing, the surface layer of the photoresist layer 12 of the substrate to be processed 3 was subjected to Ar$^+$ion irradiation as shown in FIG. 4B, as in the first embodiment, and the upper portion thereof was protruded due to thermal expansion, with the cross section of the resist pattern being deformed into an overhang-like configuration.

The maximum temperature of the wafer surface attained in the processing under the conditions of this embodiment was approximately 115° C. to 135° C.

After that, the metal layer formation was effected and lift-off was performed, with the result that a satisfactory pattern formation of the metal layer (BLM layer) was eventually realized as in the first embodiment.

While the present invention has been described with reference to two embodiments, the present invention is in no way restricted to these embodiments, and it goes without saying that the sample structure, the processing apparatus, the processing conditions, etc. can be appropriately selected without departing from the scope of the present invention.

By adopting the present invention, in the pre-metal-layer-formation process to be performed when patterning the metal layer by the lift-off (separation) of the photoresist, bonding to the background due to an excessive thermal transformation imparted to the resist can be prevented, and the resist can be processed to an optimum condition for lift-off, thereby realizing a satisfactory BLM layer pattern formation for solder ball bump formation.

Thus, in accordance with the present invention, designing can be conducted on the basis of a further refined design rule, which is very effective in the production of a semiconductor device which is required to exhibit a high integration, high performance and high reliability.

What is claimed is:

1. A semiconductor device manufacturing method comprising the steps of:

forming an electrode pad on a semiconductor base;

forming a passivation layer having an opening on said electrode pad and further forming a photoresist layer having an opening on the passivation layer such that at least a part of said electrode pad is exposed through the opening of said passivation layer and the opening in said photoresist layer;

deforming said photoresist while cooling the semiconductor base;

forming a metal layer on said photoresist and on the exposed portion of said electrode pad; and removing said photoresist.

2. A semiconductor device manufacturing method according to claim 1, wherein the step of deforming said photoresist is effected by a plasma processing.

3. A method for making a semiconductor device, comprising the steps of:

forming an electrode pad on a semiconductor base;

forming a passivation layer on said electrode pad and semiconductor base including an opening therein having a first width and exposing a portion of the electrode pad;

forming a photoresist layer having a thickness on the passivation layer, said photoresist layer including an opening therein having a second larger width and exposing a portion of the passivation layer and the exposed portion of the electrode pad, the photoresist layer including an upstanding edge portion disposed about said opening;

plasma processing the photoresist layer with a plasma having a plasma density of from greater than or equal to about $1\times10^{11}$ particles/cm$^3$ to less than about $1\times10^{14}$ particles/cm$^3$ to provide a deformed photoresist layer including an undercut and an overhanging portion defined in the upstanding edge portion;

forming a metal layer having a thickness on the deformed photoresist and exposed portions of the passivation layer and electrode pad; and thereafter, removing said photoresist, wherein the thickness of the photoresist layer is not less than double the thickness of the metal layer.

4. A semiconductor device manufacturing method according to claim 3, wherein said metal layer has a layered structure comprising a chrome layer, a copper layer and a gold layer.

5. A semiconductor device manufacturing method according to claim 3, wherein the step of removing said photoresist is performed by wet etching.

6. A semiconductor device manufacturing method according to claim 3, wherein the thickness of said photoresist is not less than 3 µm.

7. A method for making a semiconductor device, comprising the steps of:

forming an electrode pad on a semiconductor base;

forming a passivation layer on said electrode pad and semiconductor base including an opening therein having a first width and exposing a portion of the electrode pad;

forming a photoresist layer having a thickness on the passivation layer, said photoresist layer including an opening therein having a second larger width and exposing a portion of the passivation layer and the exposed portion of the electrode pad, the photoresist layer including an upstanding edge portion disposed about said opening;

plasma processing the photoresist layer with a plasma in an inert gas atmosphere to provide a deformed photoresist layer including an undercut and an overhanging portion defined in the upstanding edge portion;

forming a metal layer having a thickness on the deformed photoresist and exposed portions of the passivation layer and electrode pad; and thereafter, removing said photoresist, wherein the thickness of the photoresist layer is not less than double the thickness of the metal layer.

8. A semiconductor device manufacturing method according to claim 7, wherein said metal layer has a layered structure comprising a chrome layer, a copper layer and a gold layer.

9. A semiconductor device manufacturing method according to claim 7, wherein the step of removing said photoresist is performed by wet etching.

10. A semiconductor device manufacturing method according to claim 7, wherein the thickness of said photoresist is not less than 3 µm.

11. A semiconductor device manufacturing method according to claim 7, wherein in the plasma processing step the inert gas atmosphere comprises argon gas.

* * * * *